United States Patent [19]

Kageyama et al.

[11] Patent Number: 5,574,307
[45] Date of Patent: Nov. 12, 1996

[54] SEMICONDUCTOR DEVICE AND METHOD OF PRODUCING THE SAME

[75] Inventors: Mokuji Kageyama; Yoshiaki Matsushita, both of Yokohama, Japan

[73] Assignee: Kabushiki Kaisha Toshiba, Kawasaki, Japan

[21] Appl. No.: 357,351

[22] Filed: Dec. 16, 1994

Related U.S. Application Data

[63] Continuation of Ser. No. 35,808, Mar. 23, 1993, abandoned.

[30] Foreign Application Priority Data

Mar. 27, 1992 [JP] Japan ................................ 4-071686

[51] Int. Cl.$^6$ ........................ H01L 29/167; H01L 29/207; H01L 29/227; H01L 31/0288
[52] U.S. Cl. .......................... 257/607; 257/219; 257/655; 257/928
[58] Field of Search ................................ 257/607, 219, 257/655, 928

[56] References Cited

U.S. PATENT DOCUMENTS

| | | | |
|---|---|---|---|
| 4,505,759 | 3/1985 | O'Mara | 257/656 |
| 4,548,654 | 10/1985 | Tobin | 257/617 |
| 4,851,358 | 7/1989 | Huber | 257/928 |
| 5,159,429 | 10/1992 | Bendernagel et al. | 257/655 |
| 5,198,881 | 3/1993 | Huang et al. | 257/655 |

FOREIGN PATENT DOCUMENTS

| | | |
|---|---|---|
| 59-202640 | 11/1984 | Japan. |
| 62-210627 | 9/1987 | Japan. |

OTHER PUBLICATIONS

Matsushita et al., Toshiba Gijutsu Kokai Shu, vol. 7–54, No. 89–8660, p. 93 (Sep. 28, 1989).

*Primary Examiner*—Mahshid Saadat
*Assistant Examiner*—David Ostrowski
*Attorney, Agent, or Firm*—Foley & Lardner

[57] ABSTRACT

A semiconductor apparatus has a silicon substrate sliced off from a silicon ingot produced by the pulling method or floating zone method, wherein the concentration of interstitial oxygen in a region with a depth of approximately 10 μm or less from a device forming surface is minimum except for the device forming surface. According to the present invention, in the semiconductor apparatus production process, in the inner region with a depth of approximately 10 μm from the device forming surface of the silicon substrate, the inner region affecting the device operation, oxygen does not precipitate. Moreover, in a more inner region, oxygen precipitates, thereby providing a gettering effect with respect to metal impurities.

16 Claims, 4 Drawing Sheets

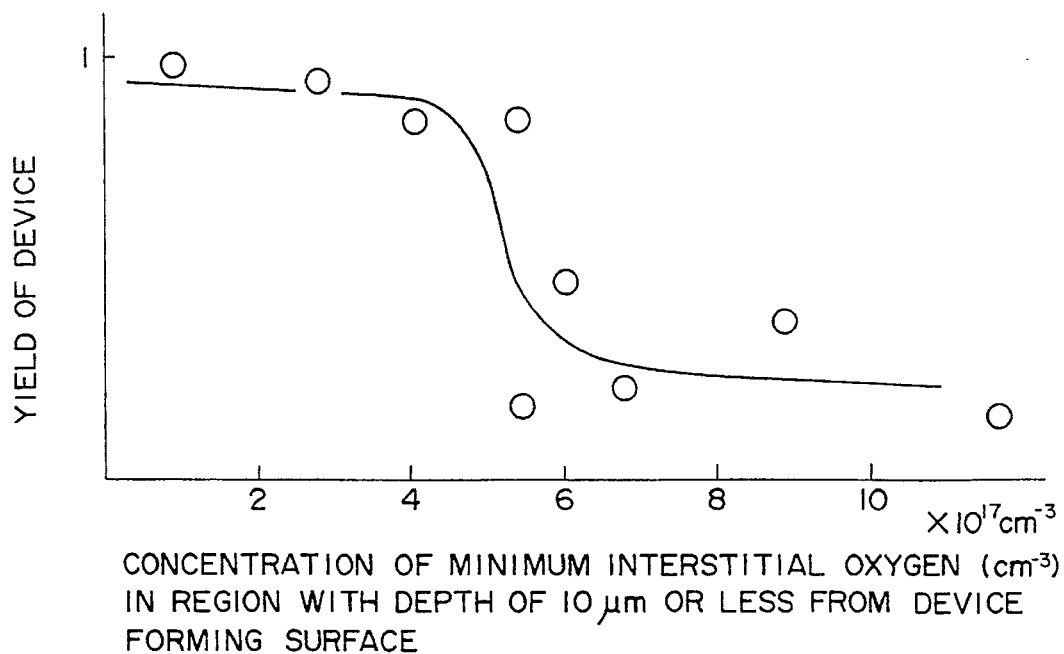
CONCENTRATION OF MINIMUM INTERSTITIAL OXYGEN ($cm^{-3}$) IN REGION WITH DEPTH OF 10 μm OR LESS FROM DEVICE FORMING SURFACE
F I G. 2
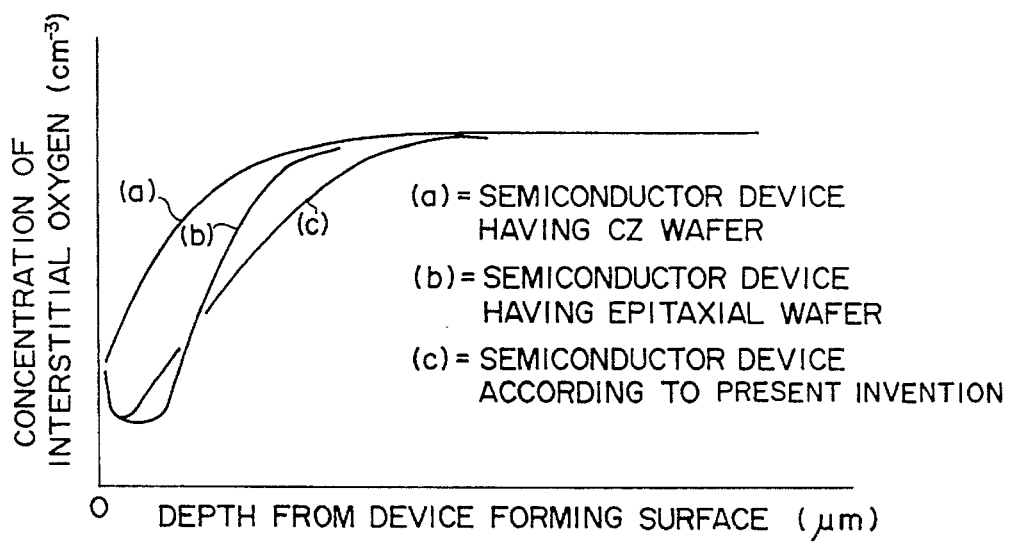
(a) = SEMICONDUCTOR DEVICE HAVING CZ WAFER
(b) = SEMICONDUCTOR DEVICE HAVING EPITAXIAL WAFER
(c) = SEMICONDUCTOR DEVICE ACCORDING TO PRESENT INVENTION
F I G. 3

SEMICONDUCTOR DEVICE AND METHOD OF PRODUCING THE SAME

This application is a continuation, of application Ser. No. 08/035,808, filed Mar. 23, 1993 now abandoned.

BACKGROUND OF THE INVENTION

1. Field of the Invention

The present invention relates to a semiconductor device having a silicon substrate sliced off from a silicon ingot produced by a pulling method (Czochralski method) or floating zone method (FZ method) and to a method of producing the same.

2. Description of the Related Art

Nowadays, semiconductor wafers produced by the Czochralski's pulling method are being widely used for silicon substrates of semiconductor device. These semiconductor wafers are hereinafter referred to as CZ waters. When silicon is pulled out from a quartz crucible, oxygen is dissolved therein. Thus, the CZ wafers contain supersaturated oxygen. The excessive oxygen atoms are precipitated as for example $SiO_2$ in a heating step of the semiconductor device production process.

It is said that the oxygen atoms contained in the silicon as interstitial atoms contribute to improving the mechanical strength of the CZ wafer and that the precipitation for example of $SiO_2$ allows metal impurities harmful to semiconductor device to be removed therefrom. Thus, when CZ wafers are produced, the concentration of interstitial oxygen contained in silicon is properly controlled.

However, when oxygen is precipitated in the vicinity of the device forming surface (active region) of the CZ wafer, crystal defects such as OSF (Oxidation induced Stacking Fault) or defects of oxide films laminated on the CZ wafer result, which adversely affect the device on the CZ wafer.

To prevent oxygen atoms from precipitating in the vicinity of the device forming surface, the concentration of interstitial oxygen in the vicinity of the front surface of the silicon substrate is lowered so that oxygen atoms do not precipitate.

However, even if the concentration of interstitial oxygen in the vicinity of the front surface of the silicon substrate has been lowered so that oxygen atoms do not precipitate (for example, the concentration of oxygen on the outermost surface is $7\times10^{17}$ cm$^{-3}$ in former old ASTM), the distribution of concentration of interstitial oxygen in the depth direction of the substrate indicates that the concentration of interstitial oxygen of the device active region and an inner region (with a depth of approximately 10 μm from the front surface) which affects the device operation is $1\times10^{18}$ cm$^{-3}$ or more. Thus, although the density of oxygen atoms is low, there are numerous interstitial oxygen atoms which can precipitate.

In the device forming process, when metal impurities such as Fe intrude into a silicon substrate, they cause the critical concentration of the precipitation of oxygen to lower. Thus, the above-mentioned concentration of oxygen is insufficient to prevent the precipitation of oxygen. Therefore, the concentration of oxygen should be sufficiently lowered both on the outermost surface of the silicon substrate and in an inner region with a depth which affects the device operation.

With respect to a so-called expitaxial wafer where a single-crystal silicon semiconductor layer is equally and expitaxially grown on the front surface of a silicon substrate, the concentration of oxygen on the epitaxial layer is so low as to prevent oxygen from precipitating. However, the production cost of the epitaxial wafers is high. In addition, the production of these wafers requires advanced technologies.

Moreover, when the concentration of interstitial oxygen of a wafer is low, its withstand resistance against thermal stress decreases. Thus, the strengths of the expitaxial wafer and the FZ wafer are lower than that of the CZ wafer. As a result, in the expitaxial wafer and the FZ wafer, dislocation and defects such as slip tend to occur, which adversely affect the device operation.

SUMMARY OF THE INVENTION

An object of the present invention is to provide a semiconductor device having both a gettering effect with respect to metal impurities which adversely affect the device and the distribution of concentration of oxygen which does not affect the device operation. Another object of the present invention is to provide a method of producing this apparatus.

The present invention in a first aspect thereof provides a semiconductor device having a silicon substrate sliced off from a silicon ingot produced by the pulling method or the floating zone method, wherein the concentration of interstitial oxygen in a region with a depth of approximately 10 μm or less from a device forming surface is minimum except for the device forming surface.

The present invention in a second aspect thereof provides a method of producing a semiconductor device, comprising the steps of producing a silicon ingot, slicing off a silicon substrate from the silicon ingot, annealing the silicon substrate so as to cause the concentration of oxygen on a device forming surface to become remarkably low, and heating the silicon substrate so as to form a device, wherein the concentration of interstitial oxygen in a region with a depth of approximately 10 μm or less from the device forming surface of the silicon substrate is minimum except for the device forming surface.

According to the present invention, in the semiconductor device production process, in the inner region with a depth of approximately 10 μm from the device forming surface of the silicon substrate, the inner region affecting the device operation, oxygen does not precipitate. Moreover, in a more inner region, oxygen precipitates, thereby providing a gettering effect with respect to metal impurities.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 2 is a graph showing the relation between the concentration of minimum interstitial oxygen in an inner region with a depth of 10 μm or less from the front device surface and the yield of the device;

FIG. 3 is a graph showing the distribution of concentration of interstitial oxygen in silicon substrates of CMOS devices of a prior art example and an embodiment of the present invention;

DESCRIPTION OF PREFERRED EMBODIMENT

Next, an embodiment according to the present invention will be described. In this example, a silicon substrate is used. The silicon substrate is produced in the following steps. In the first step, a silicon ingot is produced by the Czochralski's pulling method. In the next step, a silicon substrate is sliced off from the silicon ingot. However, it should be noted that the present invention can be similarly applied also to a silicon substrate which has been produced by the floating zone method.

Figure 6:
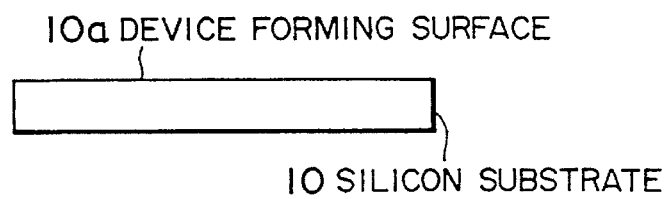
FIG. 6 is a schematic diagram showing a silicon substrate.

First, by the Czochralsk's pulling method, a silicon ingot is produced. From this ingot, a silicon substrate 10 with a specific thickness (see FIG. 6) is sliced off. As the first device forming step, the silicon substrate is annealed in 100% high-pure hydrogen gas atmosphere at a temperature of for example 1,150° C. for four hours. Thereafter, a semiconductor device is obtained through the same steps as the conventional CMOS forming steps.

When the silicon substrate sliced off from the silicon ingot is processed in reductive atmosphere of hydrogen gas, oxygen atoms on the front surface of the silicon substrate react with hydrogen, and thereby the concentration of oxygen on the front surface of the silicon substrate becomes remarkably low. As a result, the external diffusion of oxygen atoms is accelerated. Thus, just after the silicon substrate has been annealed, the concentration of interstitial oxygen on the front surface of the silicon substrate becomes minimum as shown by a solid line of FIG. 1.

It is known that Fe, which is one of most harmful metal elements with respect to the device, is coupled with oxygen atoms in the silicon substrate at low temperature, thereby forming precipitation nuclei of oxygen. When oxygen atoms precipitate in a region with a depth of approximately 10 μm or less from the device forming surface of the silicon substrate 10 (namely, the device active region and the neighbor region which affects the device active region), the probability that the oxygen atoms will cause device failure increases remarkably. In other words, when Fe and supersaturated oxygen are present in such a region, the precipitation of oxygen is accelerated. This problem can be effectively solved by removing the supersaturated oxygen.

By annealing the silicon substrate in a hydrogen gas atmosphere, the supersaturated oxygen can be removed from the above-mentioned region. In addition, when the temperature is lowered, by externally diffusing the Fe atoms which are present in the region, they can be precipitated to the outside of the silicon substrate.

According to the semiconductor device with the above-mentioned distribution of concentration of interstitial oxygen, even if metal impurities are present in the silicon substrate, the concentration of interstitial oxygen in the device active region and the neighbor region (with a depth of approximately 10 μm or less from the device forming surface) which affects the device active region is not high enough to cause oxygen to precipitate. Thus, the production yield of the device can be remarkably improved.

Figure 1:
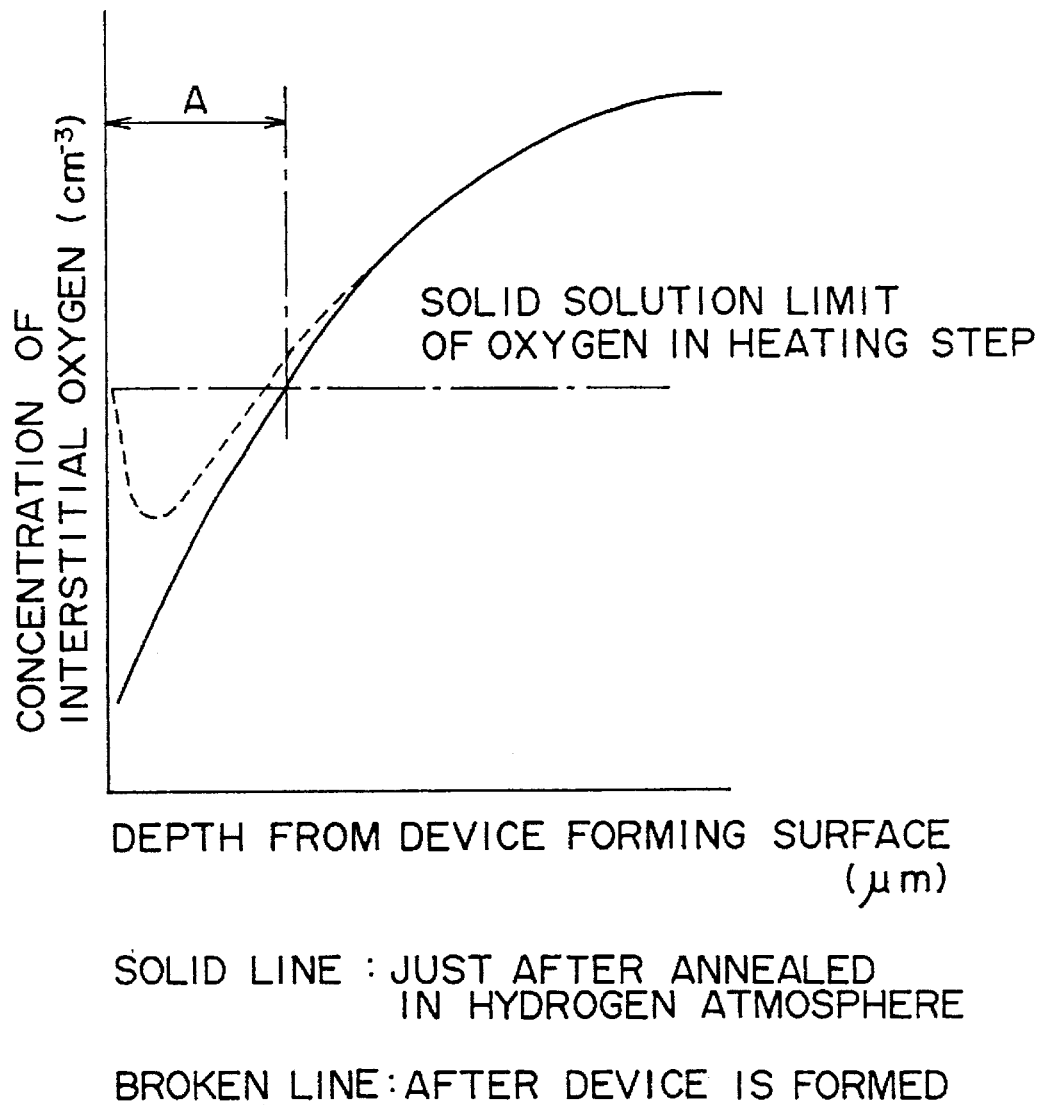
FIG. 1 is a graph showing the distribution of concentration of interstitial oxygen in the vicinity of the front surface of a silicon substrate heated in reductive atmosphere.

A broken line of FIG. 1 represents the concentration of interstitial oxygen around the front surface of the silicon substrate just after the semiconductor device has been produced. The minimum value of the concentration is present in a region with a depth of, for example, approximately 1 μm from the device forming surface of the silicon substrate. Oxygen on the outer side of the region of the minimum value was infiltrated due to diffusion, in the heating step which was performed several times when the device was formed. At temperatures at which oxygen precipitated compounds grow, since the interstitial oxygen in this region is not supersaturated, the precipitation thereof does not take place.

In other words, as shown by A of FIG. 1, a region with the concentration of interstitial oxygen lower than the solid solution limit of oxygen nearly coincides with the device active region and the neighbor region which affects the device active region. In this region shown by A, since oxygen does not precipitate, the device is not affected by the precipitation. In addition, in the inner region which is deeper than the solid solution limit, since oxygen precipitates, the gettering effect for metal impurities can be expected.

FIG. 2 shows the relation between the concentration of minimum interstitial oxygen in a region with a depth of 10 μm or less from the device forming surface of the silicon substrate and the yield of the device. In this case the minimum value of the concentration of interstitial oxygen is present in a region with a depth of 1 μm from the device forming surface.

As shown in FIG. 2, when the concentration of interstitial oxygen in a region with a depth of approximately 10 μm or less from the front surface of a silicon substrate is $5 \times 10^{17}$ $cm^{-3}$, or less the yield of the device can be improved.

In a conventional semiconductor device with the distribution of typical concentration of interstitial oxygen (see FIG. 3 (a)), only the outermost surface is a region where oxygen is not saturated (hereinafter, this region is referred to as a non-oxygen-saturated region). Thus, since the saturation temperature is substantially low, there is a region where oxygen does not precipitate (this region is referred to as the DZ region). However, when metal impurities intrude into the silicon substrate thereof, oxygen precipitates in the DZ region. Thus, the device becomes sensitive to metal contamination. As a result, the yield of the device does not improve. On the other hand, in the semiconductor device having the above-mentioned distribution of concentration of interstitial oxygen according to the present invention (see FIG. 3(c)), even if metal impurities infiltrate into the silicon substrate thereof, oxygen does not precipitate.

In other words, when only the outermost surface is a non-oxygen-saturated region (see FIG. 3(a)), the non-oxygen-saturated region is limited to a narrow region in the vicinity of the outermost surface. Thus, even in a region close to the outermost surface, oxygen is apt to precipitate. In addition, when metal impurities infiltrate thereinto, oxygen is very likely to precipitate.

On the other hand, according to the present invention (see FIG. 3(c)), since the non-oxygen-saturated region is in a wide range from the outermost surface of the silicon substrate to an inner region with for example a depth of 10 μm therefrom, the precipitation of oxygen can be prevented in such a wide range. FIG. 3 is a graph showing the distribution of concentration of interstitial oxygen in silicon substrates of a CMOS (complementary-metal-oxide-semiconductor) devices (a) having CZ wafer and a device (b) having an expitaxial wafer according to the prior art example and the embodiment (c) of the present invention.

Figure 4:
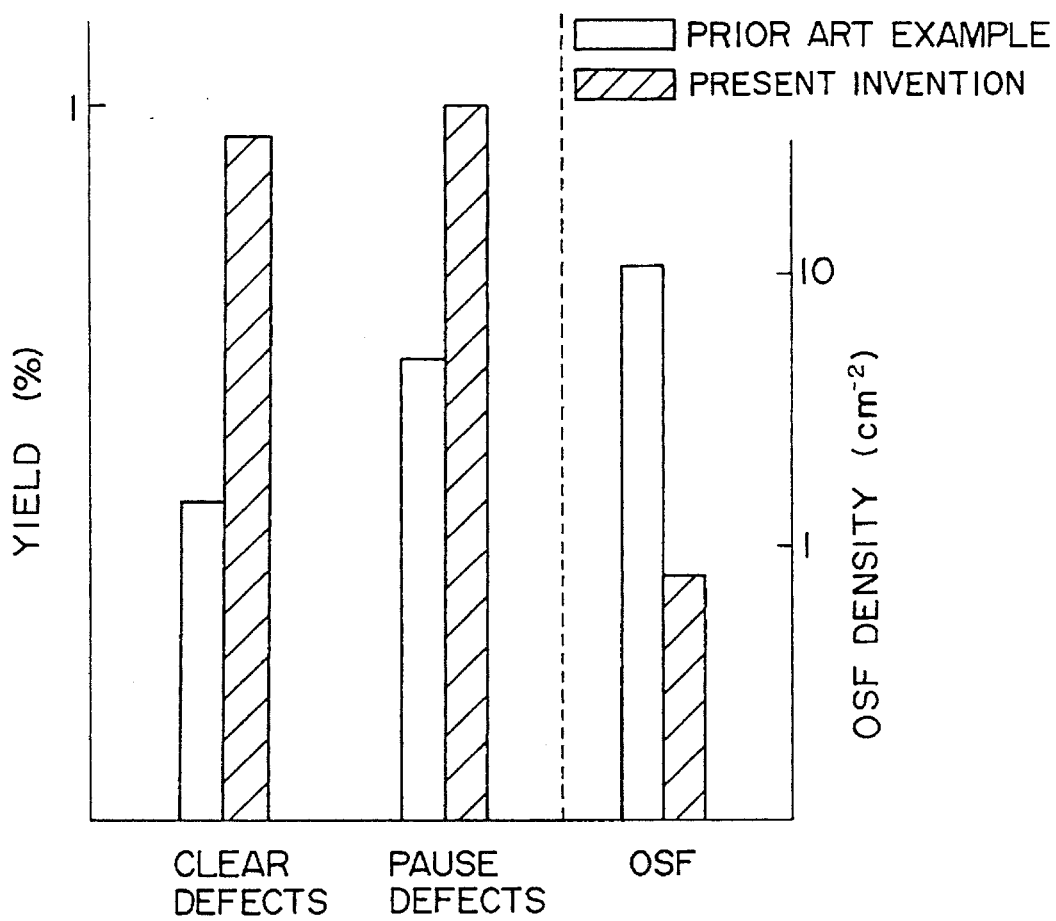
FIG. 4 is a graph showing the yield of CCD clear defects, yield of DRAM pause defects, and MROM OSF density according to a prior art example and the embodiment.

FIG. 4 is a graph showing the yield of clear defects of CCD (Charge Coupled Device), the yield of pause defects of DRAM (Dynamic Random Access Memory), and the OSF (Oxidation induced Stacking Fault) density of MROM of the semiconductor device according to the prior art example (see FIG. 3(a)) and the embodiment (see FIG. 3(c)). As shown in FIG. 4, these three examples indicate that the distribution of oxygen according to the embodiment is superior to that according to the prior art example.

Thus, when the concentration of interstitial oxygen in a region with a depth of 10 μm or less from the device forming surface is $5\times10^{17}$ atoms/cm$^3$ or less, which is the minimum value, the high yield as shown in FIG. 4 can be obtained.

As an annealing process for obtaining the above-mentioned distribution of interstitial oxygen, in addition to the above condition, a silicon substrate can be annealed in 100% high-purity hydrogen gas atmosphere at a temperature of 1200° C. for one hour and then in 100% high-purity Ar gas atmosphere at a temperature of 1100° C. for four hours, or in mixed gas atmosphere of high-purity hydrogen gas and high-purity Ar gas at a temperature of 1,100° C. for four hours. In addition, in a vacuum atmosphere, the annealing process can be performed. Moreover, during the device forming process, if. necessary, the annealing process can be performed.

Figure 5:
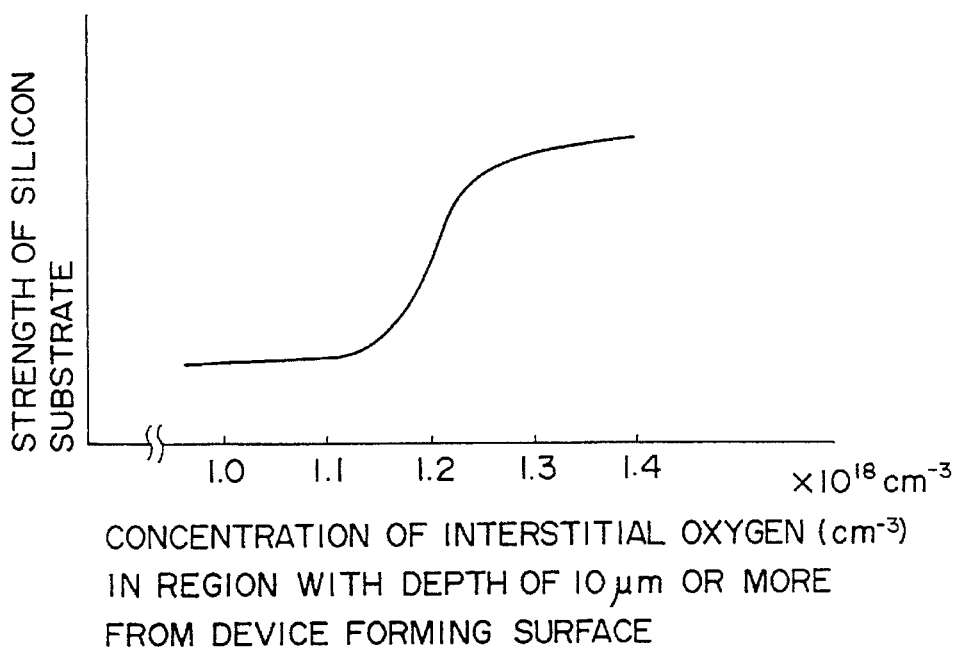
FIG. 5 is a graph showing the relation between the concentration of interstitial oxygen in an inner region with a depth of more than 10 μm from the device forming surface of a silicon substrate and the strength thereof.

FIG. 5 is a graph showing the relation between the concentration of interstitial oxygen (cm$^{-3}$) in a region with a depth of 10 μm or more from the device forming surface of a silicon substrate and the strength thereof. As shown in the figure, in a region deeper than the device active region and the neighbor region (with a depth of 10 μm or less) which affects the device active region, when the concentrations of interstitial oxygen becomes $1.2\times10^{18}$ cm$^{-3}$ or more, due to the gettering effect, the strength of the silicon substrate increases.

According to the present invention, in the semiconductor device production process, in the inner region with a depth of approximately 10 μm or less from the device forming surface of the silicon substrate, the inner region affecting the device operation, oxygen does not precipitate. Moreover, in a more inner region which is deeper than that, oxygen precipitates, thereby providing a gettering effect against metal impurities. In addition, the front surface has the distribution of interstitial oxygen where crystal defects hardly take place. Thus, the malfunction of semiconductor device can be prevented and high product yield can be obtained.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor device having a silicon substrate sliced off from a silicon ingot produced by a pulling method or a floating zone method, the silicon substrate having a device forming surface wherein the minimum concentration of interstitial oxygen is in a region from the device forming surface to a depth of approximately 10 μm or less but not on the device-forming surface.

2. The semiconductor device as set forth in claim 1, wherein the concentration of interstitial oxygen in the region having a depth of approximately 10 μm and more from said device forming surface is $1.2\times10^{18}$ cm$^{-3}$ or more.

3. The semiconductor device as set forth in claim 1, wherein the concentration of interstitial oxygen from the device forming surface to a depth of approximately 10 μm is $5\times10^{17}$ cm$^{-3}$ or less.

4. A semiconductor device as set forth in claim 1, which is produced by a method, comprising the steps of:

producing the silicon ingot;

slicing off the silicon substrate from said silicon ingot;

annealing said silicon substrate so as to cause the concentration of oxygen on a device forming surface to be reduced; and heating said silicon substrate so as to form the device.

5. The semiconductor device as set forth in claim 4, wherein said annealing step comprises the steps of:

heating said silicon substrate in a hydrogen gas atmosphere; and heating said silicon substrate in an argon gas atmosphere.

6. The semiconductor device as set forth in claim 4, wherein said annealing step is performed while said silicon substrate is being heated in a mixed gas atmosphere of hydrogen gas and argon gas.

7. The semiconductor device as set forth in claim 4, wherein said annealing step is performed while said silicon substrate is being heated in a vacuum atmosphere.

8. A semiconductor device as set forth in claim 1, wherein the silicon substrate is sliced of from a silicon ingot produced by a pulling method.

9. A semiconductor device as set forth in claim 1, wherein the silicon substrate is sliced of from a silicon ingot produced by a floating zone method.

10. A semiconductor device as set forth in claim 4, wherein the annealing comprises heating said silicon substrate in an atmosphere comprising hydrogen.

11. A semiconductor device as set forth in claim 4, wherein the annealing comprises heating said silicon substrate in an atmosphere comprising 100% hydrogen.

12. A semiconductor device as set forth in claim 5, wherein said hydrogen gas atmosphere is 100% hydrogen and said argon gas atmosphere is 100% argon.

13. A semiconductor device as set forth in claim 1, wherein at depths of greater than 10 microns, interstitial oxygen is present in sufficient amounts such that oxygen precipitates and a gettering effect with respect to potential metal impurities occurs.

14. A semiconductor device as set forth in claim 1, wherein from the device-forming surface to depths of less than 10 microns, interstitial oxygen is only minimally present such that the operation of the device is not adversely affected by potential metal impurities which may cause oxygen to precipitate.

15. A semiconductor device as set forth in claim 1, wherein the minimum concentration of interstitial oxygen is at a depth of about 1 micron from the device-forming surface.

16. A semiconductor device as set forth in claim 1, wherein from the device-forming surface to depths of less than 10 microns, substantially no supersaturated intersticial oxygen is present.

* * * * *